(12) United States Patent
Huang et al.

(10) Patent No.: US 9,648,765 B1
(45) Date of Patent: May 9, 2017

(54) ANTI-DISASSEMBLY PROTECTION STRUCTURE

(71) Applicants: NANNING FUGUI PRECISION INDUSTRIAL CO., LTD., Nanning (CN); HON HAI PRECISION INDUSTRY CO., LTD., New Taipei (TW)

(72) Inventors: Ying-Jui Huang, New Taipei (TW); Sheng-Yen Lin, New Taipei (TW)

(73) Assignees: NANNING FUGUI PRECISION INDUSTRIAL CO., LTD., Nanning (CN); HON HAI PRECISION INDUSTRY CO., LTD., New Taipei (TW)

( * ) Notice: Subject to any disclaimer, the term of this patent is extended or adjusted under 35 U.S.C. 154(b) by 0 days.

(21) Appl. No.: 14/974,188

(22) Filed: Dec. 18, 2015

(30) Foreign Application Priority Data

Nov. 27, 2015 (TW) .............................. 104139653 A (51) Int. Cl.
| H05K 5/00 | (2006.01) |
| H05K 5/02 | (2006.01) |
| H05K 5/03 | (2006.01) |

(52) U.S. Cl.
CPC ......... H05K 5/0208 (2013.01); H05K 5/0047 (2013.01); H05K 5/03 (2013.01)

(58) Field of Classification Search
CPC ... H04M 1/0216; H05K 7/1409; H05K 3/301; H05K 7/06; H05K 7/14; G06F 1/1681; G06F 1/186; G06F 1/185

USPC ....... 361/755, 801, 802, 807, 809, 810, 759, 361/747

See application file for complete search history.

(56) References Cited

U.S. PATENT DOCUMENTS

| 2015/0313027 A1* | 10/2015 | Lin ...................... H05K 5/0208 361/752 |
| 2016/0055355 A1* | 2/2016 | Huang .................... G06F 21/87 726/34 |
| 2016/0055356 A1* | 2/2016 | Huang .................... G06F 21/88 726/35 |
| 2016/0066444 A1* | 3/2016 | Fan .................... H01R 12/7076 439/78 |

FOREIGN PATENT DOCUMENTS

| CN | 103902934 A | 7/2014 |
| CN | 104408386 A | 3/2015 |
| TW | 446272 | 7/2001 |

* cited by examiner

*Primary Examiner* — Hung S Bui
(74) *Attorney, Agent, or Firm* — Steven Reiss (57) ABSTRACT

An anti-disassembly protection structure includes a cover, a base, and a moving member. The cover includes a circuit board. The moving member includes a connecting part and at least one conducting part. The connecting part defines a plurality of receiving holes to receive the at least one conducting part. When the cover is fixed to the base, the moving member moves towards a first direction substantially perpendicular to the base to connect the at least one conducting part and the circuit board. A signal is produced by the at least one conducting part and the circuit board. When the cover is moved out of the base, the moving member moves towards a second direction opposite to the first direction. The at least one conducting part is moved away from the circuit board and is out of the plurality of receiving holes.

16 Claims, 9 Drawing Sheets

ANTI-DISASSEMBLY PROTECTION STRUCTURE

CROSS-REFERENCE TO RELATED APPLICATIONS

This application claims priority to Taiwanese Patent Application 104139653 filed on Nov. 27, 2015, the contents of which are incorporated by reference herein.

FIELD

The subject matter herein generally relates to an anti-disassembly protection structure for a housing.

BACKGROUND

Many housings provide an anti-disassembly protection structure to prevent the system from being tampered with by unauthorized users. Once the cases are opened, the system will stop working due to the anti-disassembly protection structure.

BRIEF DESCRIPTION OF THE DRAWINGS

Implementations of the present technology will now be described, by way of example only, with reference to the attached figures.

DETAILED DESCRIPTION

It will be appreciated that for simplicity and clarity of illustration, where appropriate, reference numerals have been repeated among the different figures to indicate corresponding or analogous components. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. Also, the description is not to be considered as limiting the scope of the embodiments described herein. The drawings are not necessarily to scale and the proportions of certain parts may be exaggerated to better illustrate details and features of the present disclosure.

Several definitions that apply throughout this disclosure will now be presented.

The term "substantially" is defined to be essentially conforming to the particular dimension, shape, or other feature that the term modifies, such that the component need not be exact. For example, "substantially cylindrical" means that the object resembles a cylinder, but can have one or more deviations from a true cylinder. The term "comprising" when utilized, means "including, but not necessarily limited to"; it specifically indicates open-ended inclusion or membership in the so-described combination, group, series and the like.

The present disclosure is described in relation to an anti-disassembly protection structure. An anti-disassembly protection structure includes a cover, a base, a mounting frame, a transmission member, and a moving member. The cover includes a circuit board. The transmission member is rotatably mounted to the mounting frame. The moving member includes a connecting part and at least one conducting part. The connecting part defines a plurality of receiving holes to receive the at least one conducting part. When the cover is fixed to the base, the cover drives the transmission member to abut the moving member. The moving member moves towards a first direction substantially perpendicular to the base to connect the at least one conducting part and the circuit board. A signal is produced by the at least one conducting part and the circuit board. When the cover is moved out of the base, the moving member moves towards a second direction opposite to the first direction. The at least one conducting part is moved away from the circuit board and is removed from the plurality of receiving holes.

Figure 1:
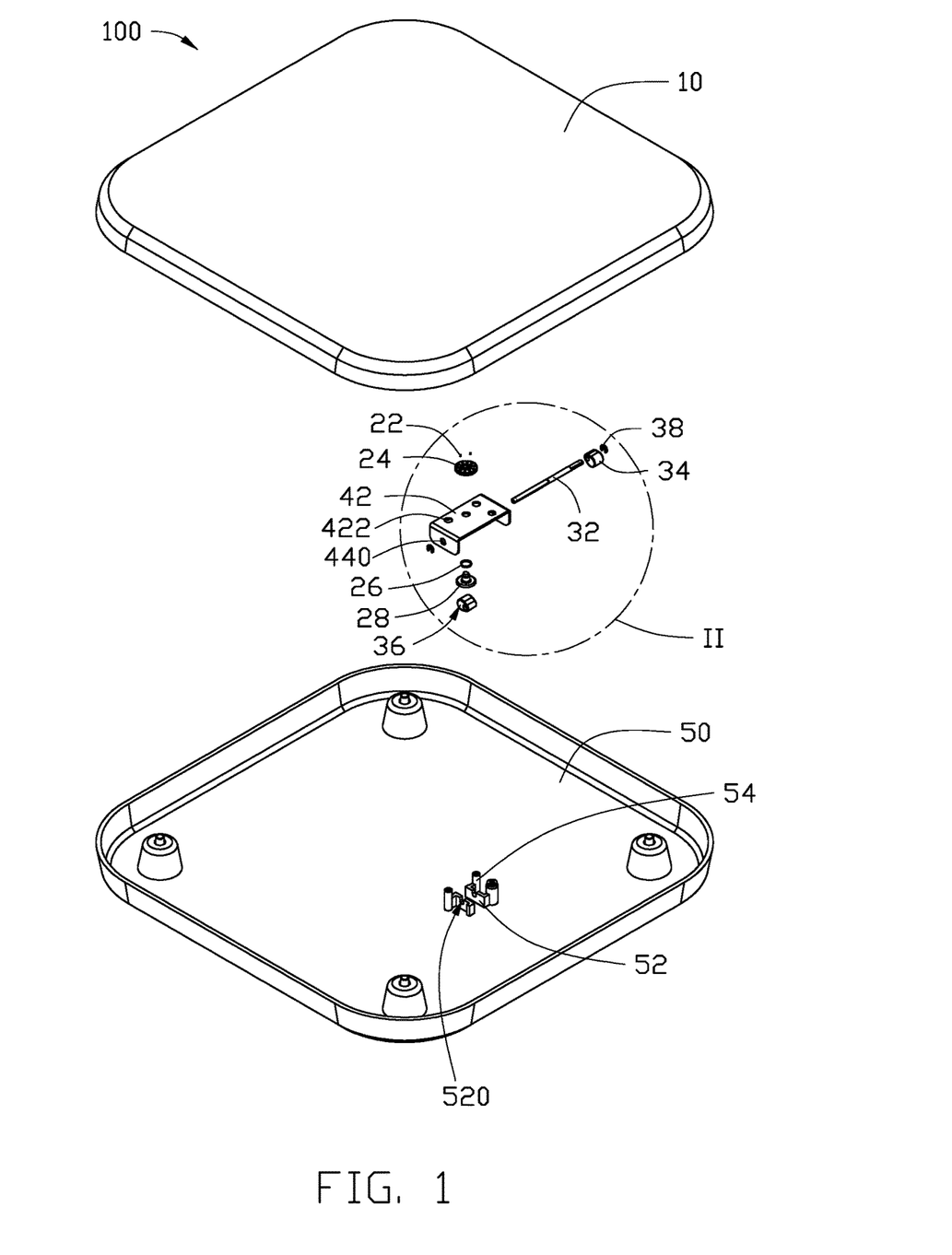
FIG. 1 is an exploded, isometric view of one embodiment of an anti-disassembly protection structure.
Figure 2:
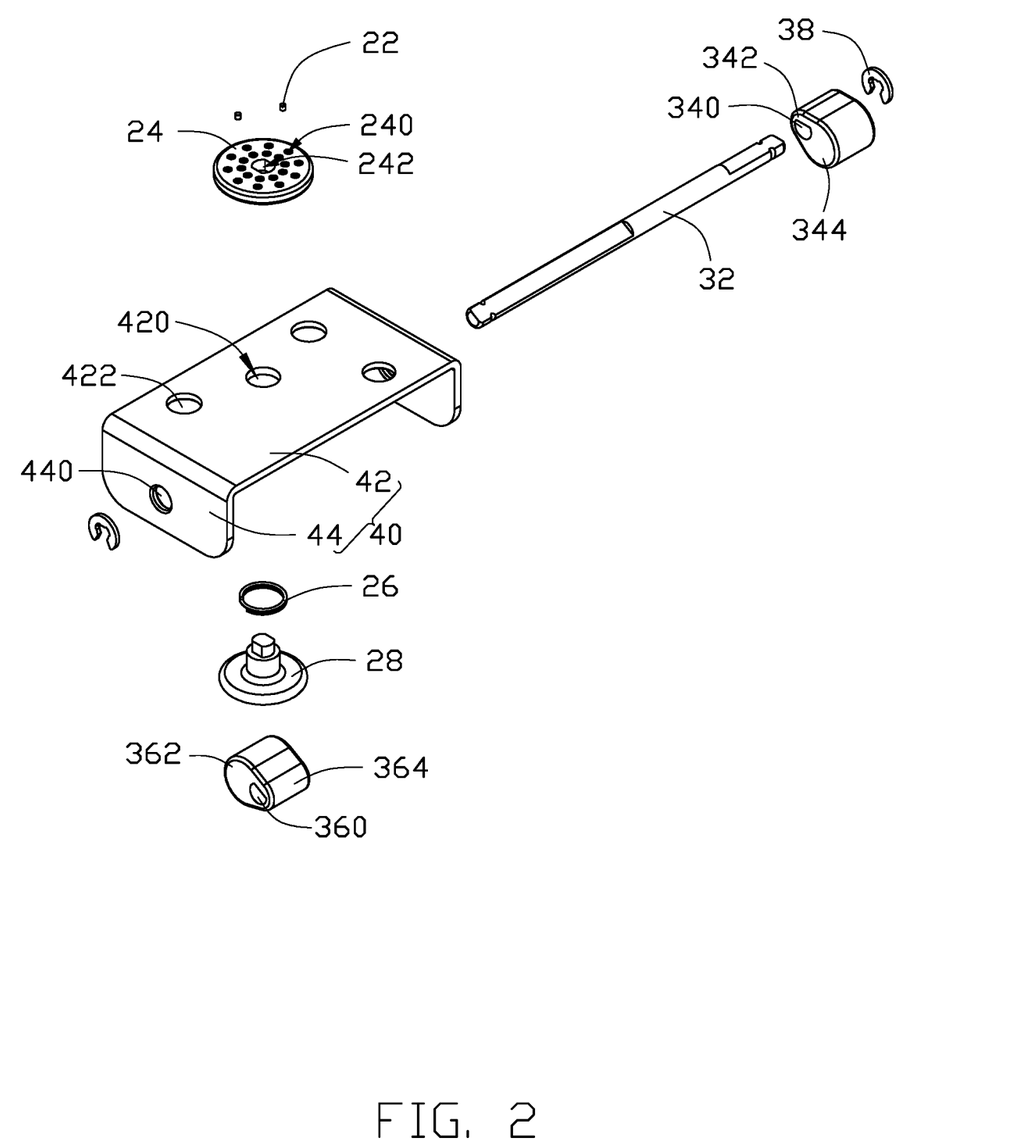
FIG. 2 is an enlarged view of a circled portion II of FIG. 5.

FIGS. 1-2 illustrate one embodiment of an anti-disassembly protection structure 100. The anti-disassembly protection structure 100 includes a cover 10, a moving member 20 (see in FIG. 6), a transmission member 30 (see in FIG. 5), a mounting frame 40, and a base 50.

The moving member 20 includes two conducting parts 22, a connecting part 24, an elastic part 26, and a body 28. The connecting part 24 defines a plurality of receiving holes 240 and a fastening hole 242. In at least one embodiment, the elastic part 26 can be a spring.

The transmission member 30 includes a shaft 32, a first cam 34, a second cam 36, and two fastening members 38. In at least one embodiment, each fastening member 38 can be substantially e-shaped. The first cam 34 includes a first end 342 and a second end 344. A radius of the first end 342 can be less than a radius of the second end 344. A first aligning hole 340 can be defined in the first end 342. The second cam 36 includes a first end 364 and a second end 362. A radius of the first end 364 can be less than a radius of the second end 362. A second aligning hole 360 can be defined in the first end 364. The mounting frame 40 includes a panel 42 and two side plates 44. In at least one embodiment, the two side plates 44 are extended from opposite sides of the panel 42 and can be substantially perpendicular to the panel 42. The panel 42 defines a through hole 420 and a plurality of fastening holes 422. Each side plate 44 defines a mounting hole 440. The mounting frame 40 can be substantially U-shaped.

The base 50 includes two supporting portions 52 and a plurality of fastening columns 54. Each supporting portion 52 defines a groove 520.

Figure 3:
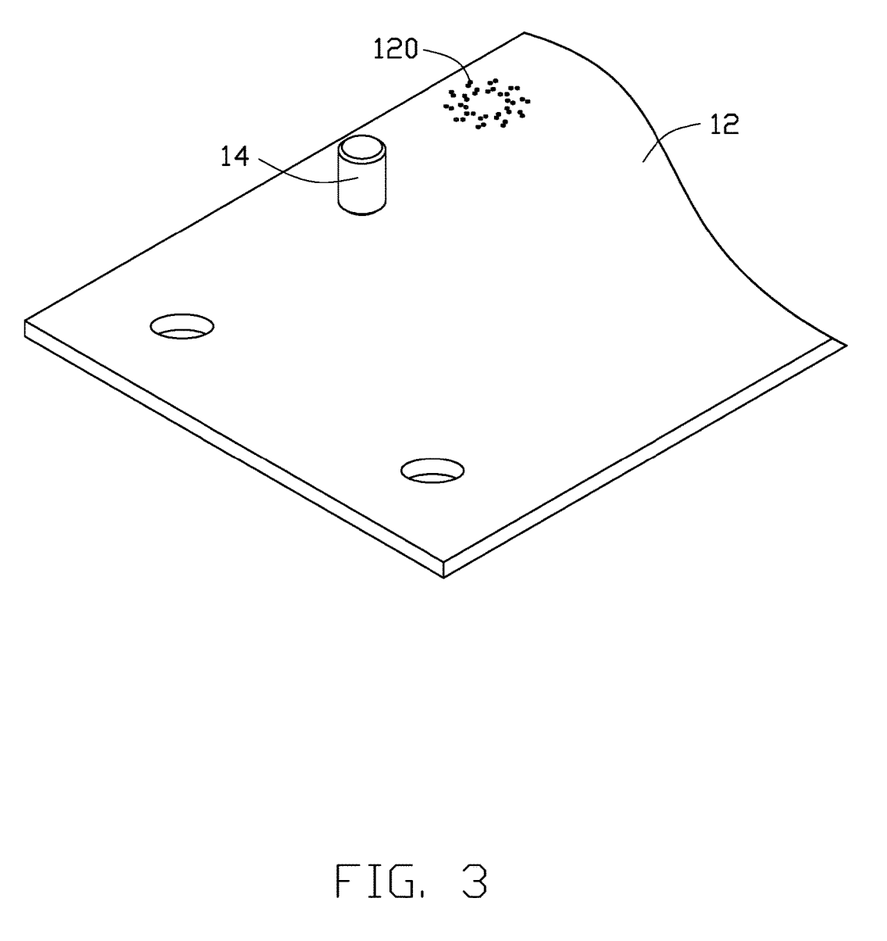
FIG. 3 is an isometric view of a circuit board of the anti-disassembly protection structure of FIG. 1.

FIG. 3 illustrates the cover 10 of anti-disassembly protection structure 100. The cover 10 includes a circuit board 12 and a driving portion 14. The driving portion 14 is extended from the circuit board 12 and can be substantially perpendicular to the circuit board 12. The circuit board 12 includes a plurality of touch points 120.

Figure 4:
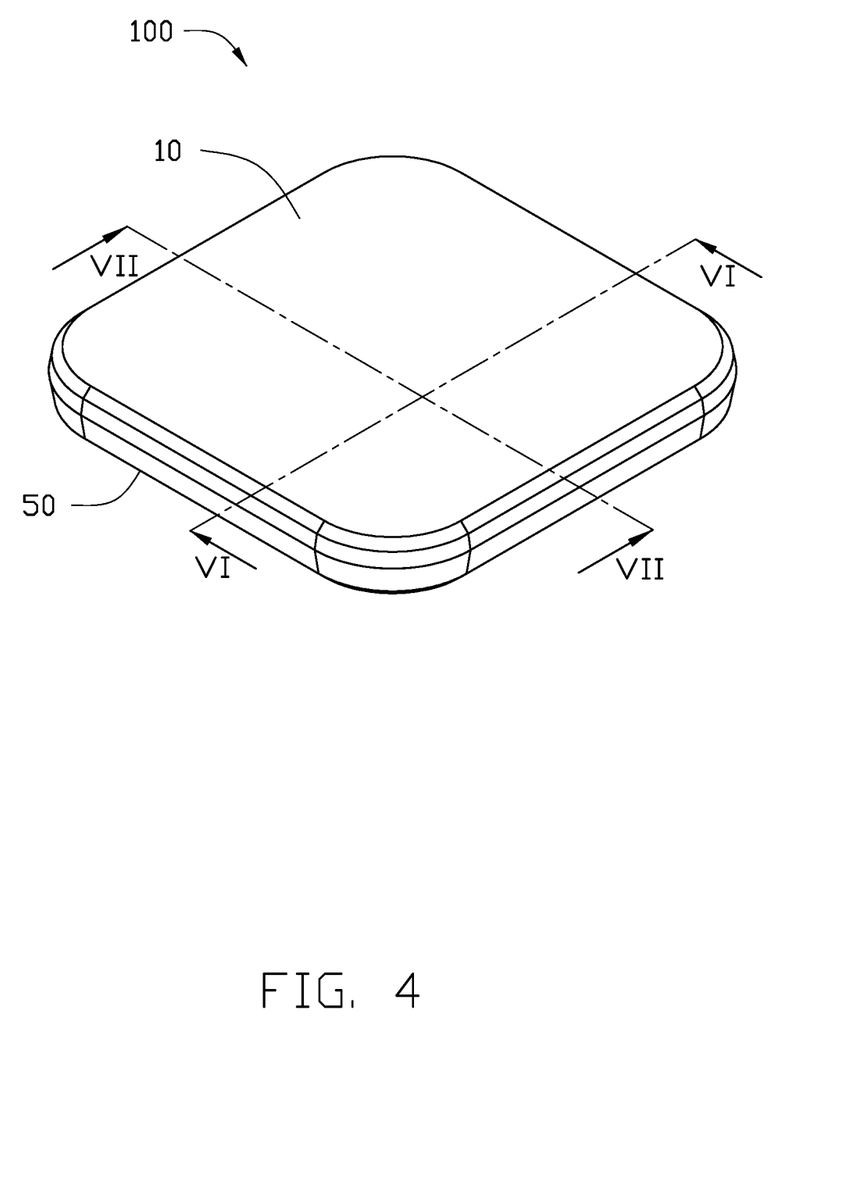
FIG. 4 is an assembled, isometric view of the anti-disassembly protection structure of FIG. 1.
Figure 5:
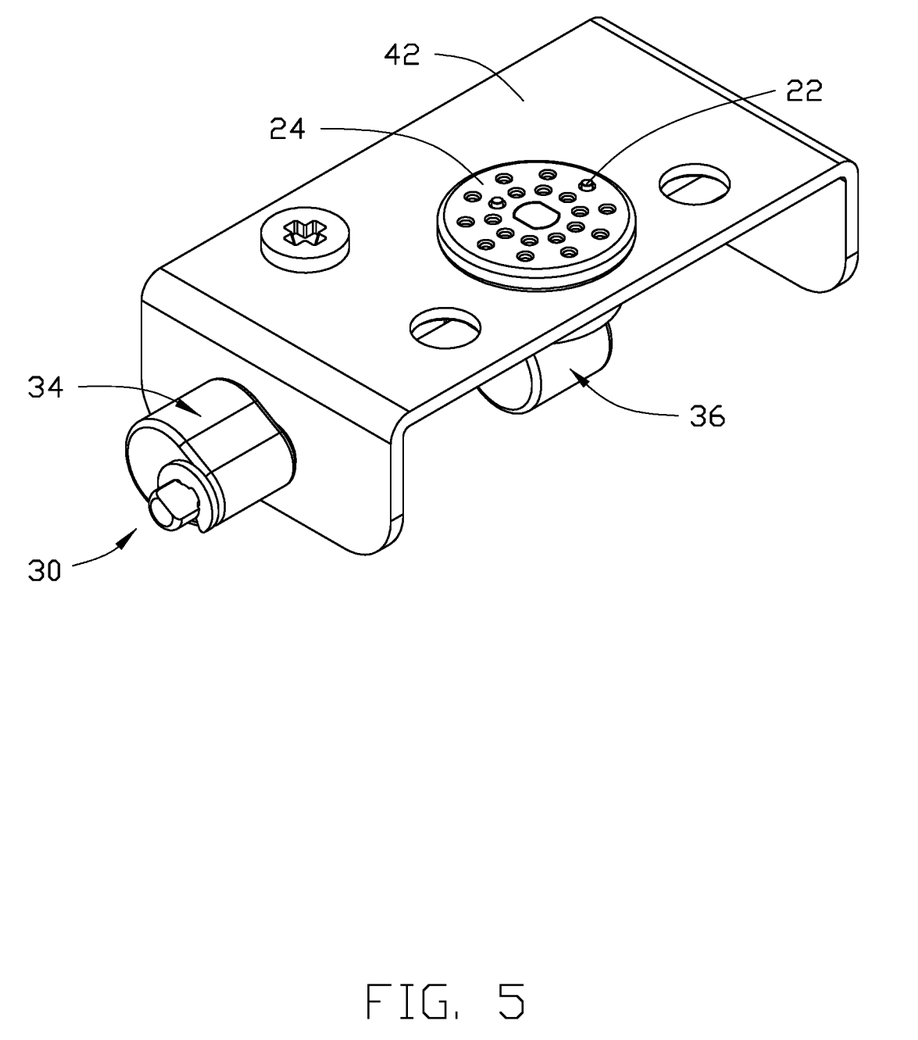
FIG. 5 is an isometric view of an internal structure of the anti-disassembly protection structure of FIG. 1.

FIGS. 4-5 illustrate the housing anti-disassembly protection structure 100 being assembled. A plurality of screws (not shown) extend into the plurality of fastening holes 422 and can be engaged with the plurality of fastening columns 54 to fix the mounting frame 40 to the base 50. The elastic part 26 is sheathed with the body 28. The body 28 extends into the through hole 420 and can be engaged in the fastening hole 242. The elastic part 26 abuts against the panel 42. The two conducting parts 22 are received in two of the plurality of receiving holes 240. One of the two fastening members 38 is fixed to one end of the shaft 32. The shaft 32 extends into the first aligning hole 340, the mounting hole 440 of one of the two side plates 44, the second aligning hole 360, and the mounting hole 440 of another side plate 44. Another fastening member 38 is fixed to the shaft 32. The second cam 36 is located between the two supporting portions 52. The shaft 32 is received in the two grooves 520.

Figure 6:
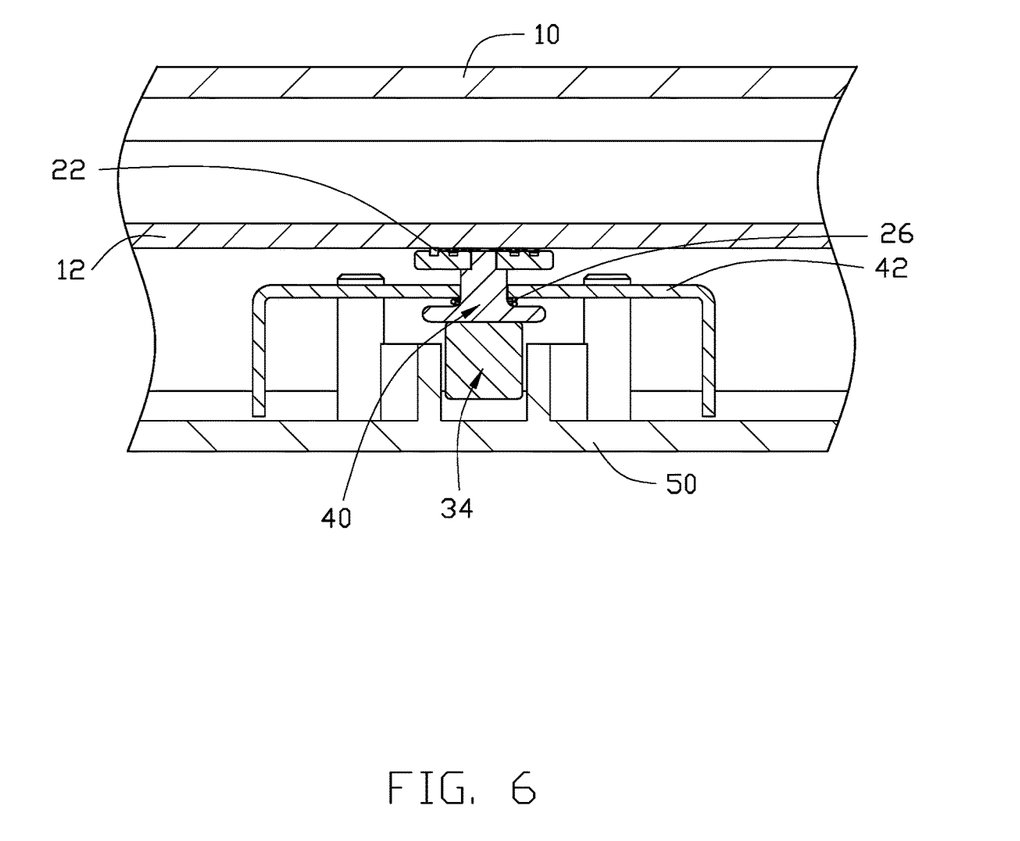
FIG. 6 is a cross-sectional view of the anti-disassembly protection structure, taken along a line VI-VI of FIG. 4.
Figure 7:
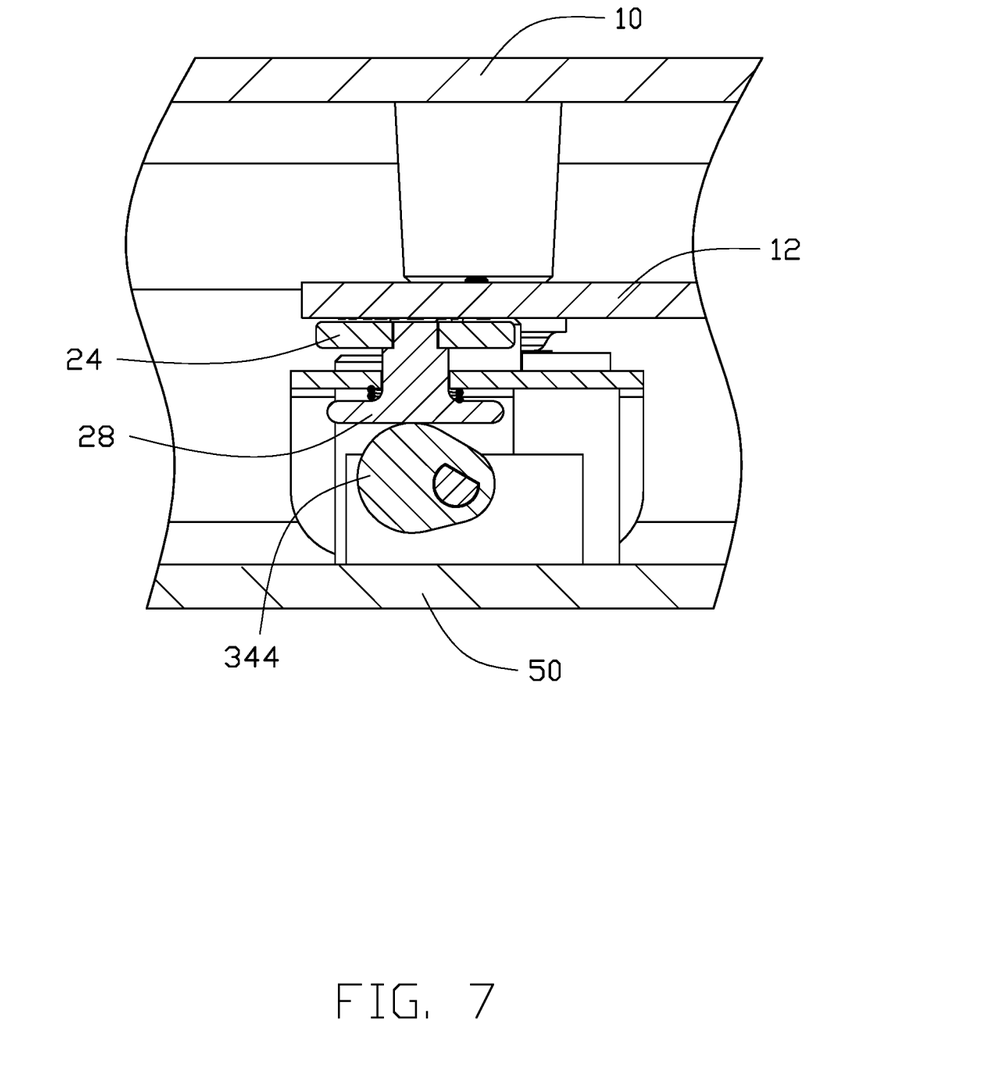
FIG. 7 is a cross-sectional view of the anti-disassembly protection structure, taken along a line VII-VII of FIG. 4.

FIGS. 6-7 illustrate an internal structure of the anti-disassembly protection structure 100. When the cover 10 is fixed to the base 50, the shaft 32 is rotated by the driving portion 14 via the first end 342 of the first cam 34. The second end 362 of the second cam 36 abuts against the body 28. The elastic part 26 is deformed by the body 28. The moving member 20 moves towards a first direction substantially perpendicular to the base 50. Each conducting part 22 abuts against two of the plurality of touch points 120. The two of the plurality of touch points 120 are electrically connected, and produce a signal. If the touch points 120 connected to the conducting part 22 are different, the signals produced by the touch points 120 are different. In at least one embodiment, the number of the touch points 120 is more than the number of conducting parts 22. The number of conducting parts 22 is different, and the signals are different.

Figure 8:
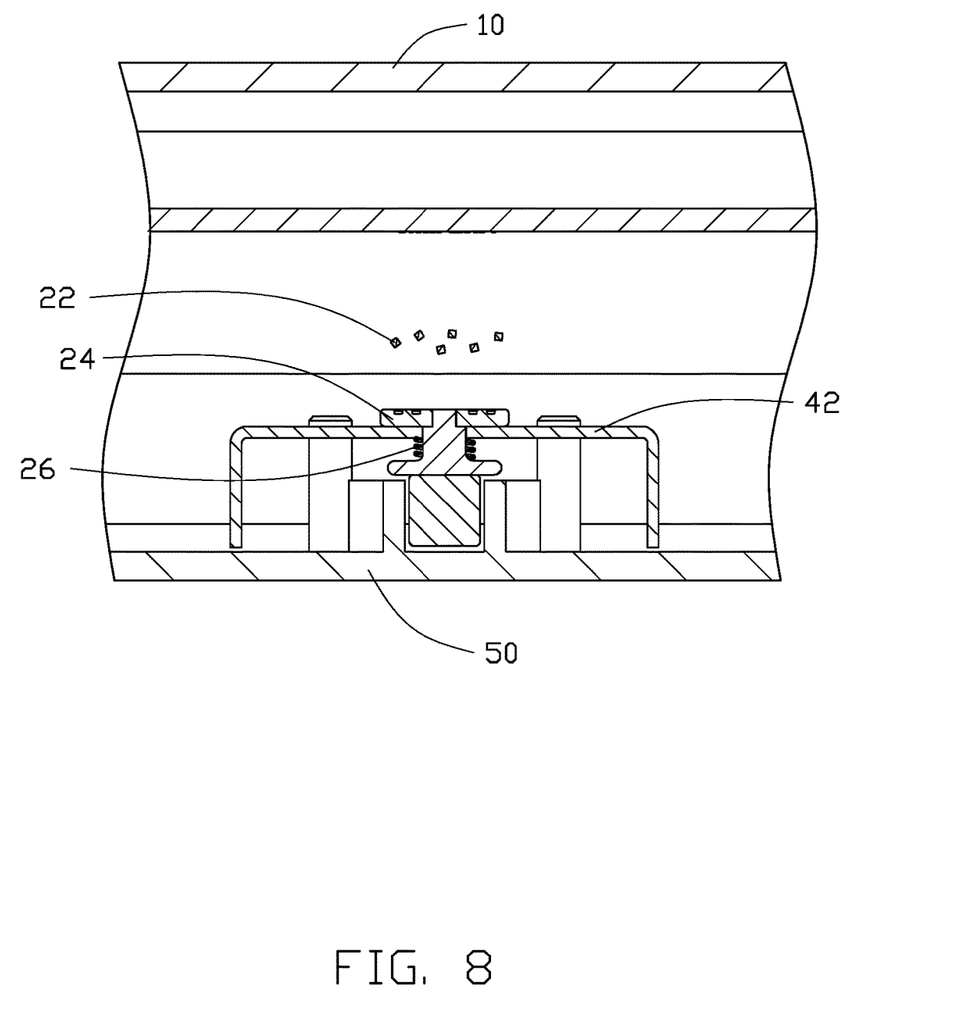
FIG. 8 is similar to FIG. 6, but in a working state.
Figure 9:
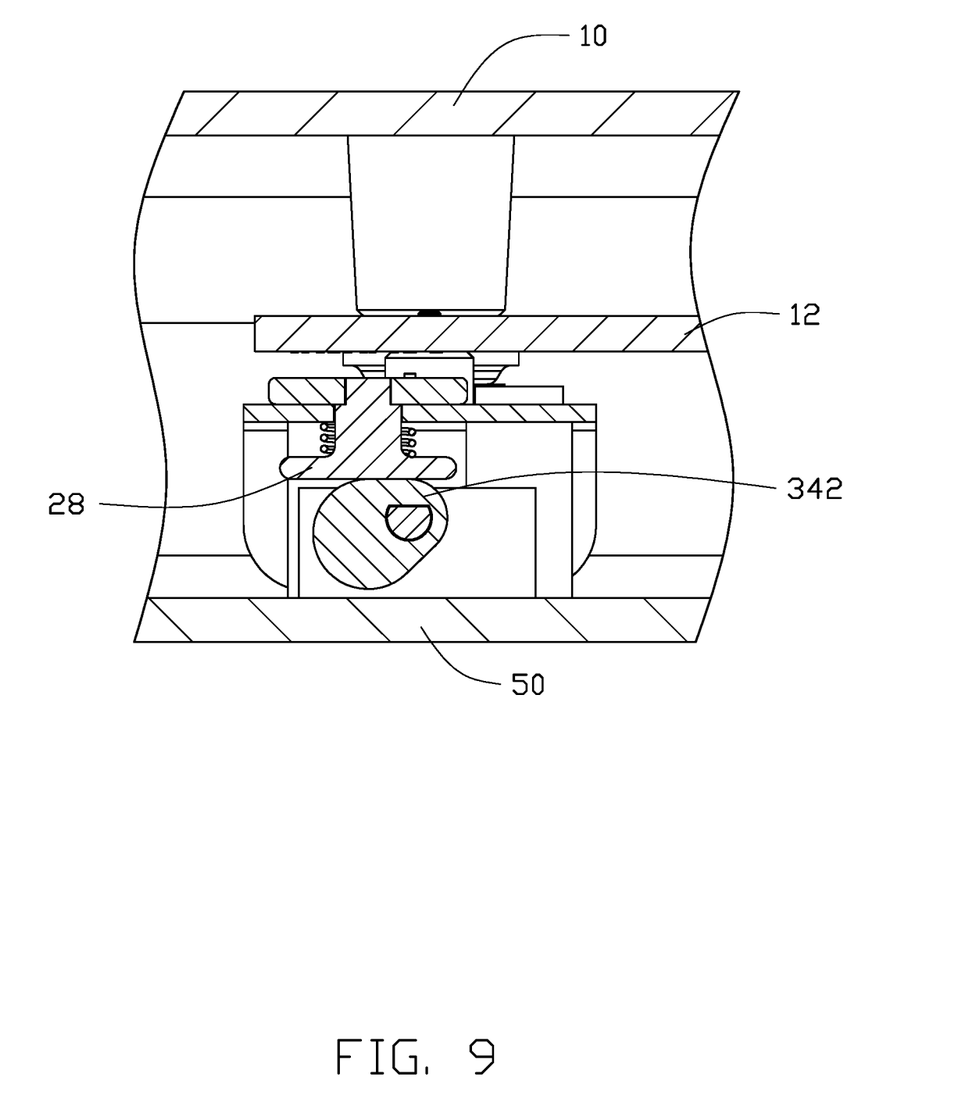
FIG. 9 is similar to FIG. 7, but in a working state.

FIGS. 8-9 illustrate the anti-disassembly protection structure 100 in operation. When the cover 10 is moved out of the base 50, the driving portion 14 is moved away from the first end 342 of the first cam 34. The shaft 32 and the second cam 36 rotate. The elastic part 26 returns to a relaxed state. The moving member 20 moves towards a second direction opposite to the first direction. The connecting part 24 impacts the panel 42, and the two conducting parts 22 move out of the two receiving holes 240 and move away from the touch points 120. Therefore, it cannot be known which conducting part 22 connects to which touch point 120. Even if the cover 10 is fixed to the base 50 again, the receiving holes 240 receiving the two conducting parts 22 will be different than before. The signal produced by the plurality of touch points 120 will be wrong and a system will stop working to prevent tampering by unauthorized users.

The embodiments shown and described above are only examples. Many details are often found in the art such as the other features of the anti-disassembly protection structure. Therefore, many such details are neither shown nor described. Even though numerous characteristics and advantages of the present technology have been set forth in the foregoing description, together with details of the structure and function of the present disclosure, the disclosure is illustrative only, and changes may be made in the details, especially in matters of shape, size, and arrangement of the parts within the principles of the present disclosure, up to and including the full extent established by the broad general meaning of the terms used in the claims. It will therefore be appreciated that the embodiments described above may be modified within the scope of the claims.

What is claimed is:
1. An anti-disassembly protection structure comprising:
a base;
a cover comprising a circuit board and configured to be releasably secured to the base;
a mounting frame being fixed to the base;
a transmission member being rotatably mounted to the mounting frame; and
a moving member comprising a connecting part and at least one conducting part, and the connecting part defining a plurality of receiving holes to receive the at least one conducting part;
wherein when the cover is fixed to the base, the transmission member abuts the moving member, and the moving member is moveable towards a first direction substantially perpendicular to the base to connect the at least one conducting part to the circuit board, wherein when the cover is moved out of the base, the moving member is moveable towards a second direction opposite to the first direction, and the at least one conducting part is moved away from the circuit board and is deviate away from the plurality of receiving holes.

2. The anti-disassembly protection structure of claim 1, wherein the circuit board comprises a plurality of touch points, and the at least one conducting part is connected to two of the plurality of touch points.

3. The anti-disassembly protection structure of claim 1, wherein the mounting frame is fixed to the base, the transmission member comprises a shaft, and the shaft is rotatably fixed to the mounting frame.

4. The anti-disassembly protection structure of claim 3, wherein the transmission member comprises a first cam and a second cam, the first cam and the second cam are fixed to the shaft, when the cover is fixed to the base, a second end of the second cam abuts the moving member; and when the cover is moved out of the base, a first end of the second cam abuts the moving member.

5. The anti-disassembly protection structure of claim 4, wherein the base comprises two supporting portions, each supporting portion defines a groove, the shaft is received in the two grooves, and the second cam is located between the two supporting portions.

6. The anti-disassembly protection structure of claim 4, wherein the cover comprises a driving portion, when the cover is fixed to the base, the driving portion abuts the first cam, and the first cam is rotatable by the driving portion.

7. The anti-disassembly protection structure of claim 1, wherein the moving member further comprises a body and an elastic part sheathed with the body, the mounting frame defines a through hole, the body extends into the through hole and is fixed into the connecting part, and the elastic part abuts the mounting frame.

8. The anti-disassembly protection structure of claim 1, wherein the mounting frame is U-shaped.

9. An anti-disassembly protection structure comprising:
a cover comprising a circuit board; and
a moving member comprising a connecting part and at least one conducting part, and the connecting part defining a plurality of receiving holes to receive the at least one conducting part;
wherein the moving member is moveable between a first location and a second location, when the moving member is in the first location, the cover abuts the moving member, the at least one conducting part is connected to the circuit board, the at least one conducting part and the circuit board produce a signal; and when the moving member is in the second location, the cover away from the moving member, the at least one conducting part is moved away from the circuit board and is deviate away of the plurality of receiving holes.

10. The anti-disassembly protection structure of claim 9, wherein the circuit board comprises a plurality of touch points, and the at least one conducting part is connected to two of the plurality of touch points.

11. The anti-disassembly protection structure of claim 9, further comprising a transmission member and a mounting frame, wherein the transmission member comprises a shaft, and the shaft is rotatably fixed to the mounting frame.

12. The anti-disassembly protection structure of claim 11, further comprising a base, wherein the transmission member comprises a first cam and a second cam, the first cam and the second cam are fixed to the shaft, when the cover is fixed to the base, a second end of the second cam abuts the moving member; and when the cover is moved out of the base, a first end of the second cam abuts the moving member.

13. The anti-disassembly protection structure of claim 12, wherein the base comprises two supporting portions, each supporting portion defines a groove, the shaft is received in the two grooves, and the second cam is located between the two supporting portions.

14. The anti-disassembly protection structure of claim 12, wherein the cover comprises a driving portion, when the cover is fixed to the base, the driving portion abuts the first cam, and the first cam is rotatable by the driving portion.

15. The anti-disassembly protection structure of claim 11, wherein the moving member further comprises a body and an elastic part sheathed with the body, the mounting frame defines a through hole, the body extends into the through hole and is fixed into the connecting part, and the elastic part abuts the mounting frame.

16. The anti-disassembly protection structure of claim 11, wherein the mounting frame is U-shaped.

\* \* \* \* \*